United States Patent [19]
Hwang

[11] Patent Number: 5,037,723
[45] Date of Patent: Aug. 6, 1991

[54] METHOD OF MANUFACTURING A PLASMA DISPLAY PANEL

[75] Inventor: Woo-Hyun Hwang, Suwon, Rep. of Korea

[73] Assignee: Samsung Electron Device Co., Ltd., Kyonggi, Rep. of Korea

[21] Appl. No.: 400,995

[22] Filed: Aug. 31, 1989

[30] Foreign Application Priority Data

Sep. 14, 1988 [KR] Rep. of Korea .................... 88-11871

[51] Int. Cl.$^5$ ........................ G03C 5/00; C09K 19/00; G02F 1/03
[52] U.S. Cl. .................................. 430/320; 430/323; 430/329; 430/330; 430/20
[58] Field of Search ............... 430/320, 323, 329, 330, 430/20

[56] References Cited

U.S. PATENT DOCUMENTS 4,804,615 2/1989 Larson et al. ...................... 430/314

FOREIGN PATENT DOCUMENTS 58-150248 9/1983 Japan .

OTHER PUBLICATIONS

"Thick Film Fine Pattern Formation by a Photolithographic Process", by Watanabe, Proceedings of the 29th Electronics Components Conference, May, 1979.

Primary Examiner—John Kight, III
Assistant Examiner—Kathryne E. Shelborne
Attorney, Agent, or Firm—Flynn, Thiel, Boutell & Tanis

[57] ABSTRACT

A method of manufacturing a plasma display panel formed with electrodes and barrier ribs therebetween by a photoetching method.

The invention is a process for forming respectively, electrodes and barrier ribs on glass substrates by a photoetching method; and a process for spreading the pastes deposited of each material for said electrodes and barrier ribs, and removing said pastes on the watersoluble photosensitive resin.

According to the invention, the plasma display panel can be manufactured more precisely and elaborately and it becomes possible to make it larger in size, while at the same time, manufacturing loss can be further reduced.

5 Claims, 1 Drawing Sheet

METHOD OF MANUFACTURING A PLASMA DISPLAY PANEL

BACKGROUND OF THE INVENTION

The present invention relates to a method of manufacturing a plasma display panel, also referred to as a PDP, and more particularly, to a method of manufacturing a plasma display panel having a electrodes and barrier ribs, formed by a photo-etching method.

Generally, a plasma display panel has a display element in which a gas is introduced and sealed between upper and lower electrodes, i.e., an anode and cathode which are formed respectively on two glass substrates, and numerals or letters may be displayed by utilizing the gas discharge produced in accordance with applying a voltage to said electrodes.

The general structure of the (plasma) discharge displaying panel is of a matrix which is formed with an anode composed of a plurality of parallel electrodes extending in one direction, and a cathode group composed of a plurality of parallel electrodes extending in a direction crossing said anode group, in which each confronting crossing point of each set of electrodes formed by said anode group and cathode group forms the luminant (light emitting) display means, i.e., picture element(pixel), and barrier ribs for preventing the diffusion of the plasma glow produced at the cathode are provided between the respective pixels.

Japanese laid open patent No. 150,248/ 1983, which is a prior art reference showing a gas discharge displaying panel having such a electrode structure, describes the forming of the insulation barrier ribs of predetermined height, for preventing the diffusion of the plasma glow generated, by a normal screen printing method so as to direct the plasma to the cathode group from the surface of the substrate of the anode group.

However, when manufacturing the electrodes and barrier ribs of the plasma display panel(hereinafter abreviated as PDP) by using the aforementioned normal screen printing method, the following problems arise.

That is, when using a screen printing method, although the screen mask should be made for printing and pattern forming, the screen mask can not formed in a precise pattern.

Such a screen mask is typically made by fixing polyester yarn or stainless mesh to a frame made of aluminium at a predetermined tension, spreading a photosensitive resin thereon and then forming the desired pattern. The PDP is manufactured by setting the screen mask made as above, and printing the paste for the anodes or cathodes on the surface of a glass substrate and further printing the paste for the barrier ribs through said screen mask.

As described above, in manufacturing the electrodes and of barrier ribs the PDP according to such conventional screen printing methods, because of the problem of making precisely and elaborately the screen mask pattern, i.e., the capability of making the line width of the mask up to several hundred microns is barely reached, it has been impossible to manufacture in conformity with the tendency of larger PDPs.

OBJECT AND SUMMARY OF THE INVENTION

Therefore, it is an object of the present invention to provide a manufacturing method of plasma display panels which overcomes the limitations of making the pattern precisely and elaborately that have been impossible to solve by the prior art, and manufactures the PDP by using the photo-etching method at the same time, so that manufacture in conformity with the tendency of PDPs becoming larger in size becomes possible.

In order to accomplish the above-mentioned object, the present invention is characterized in that the PDP is manufactured by forming the electrodes or barrier ribs on a watersoluble photosensitive resin spread on the surface of the glass substrate, after which the photosensitive resin is exposed and developed, and then simultaneously removing unnecessary component material contained with the watersoluble photosensitive resin.

The objects as well as advantages of the present invention will become clear by the following description of the invention with reference to the accompanying drawings.

BRIEF DESCRIPTION OF THE DRAWINGS

For a better understanding of the invention, and to show how the same may be carried out, reference will now be made, by way of example, to the accompanying drawings, in which.

DETAILED DESCRIPTION OF THE PREFERRED EMBODIMENT

A preferred embodiment of the present invention will be described in detail with reference to the accompanying drawings.

Figure 1:
FIGS. 1 to 6 are diagrams of the claimed process sequence illustrating the manufacturing method for a plasma display panel according to a preferred embodiment of the present invention.

The accompanying drawings are diagrams of the process sequences illustrating the method of manufacturing a PDP according to a preferred embodiment of the present invention. At first, the invention will be explained with respect to the cathode forming method. That is, a watersoluble photosensitive resin 2 is spread uniformly onto a glass substrate by a spin coater so that the thickness of the layer of this photosensitive resin 2 is about 20-30 μm (refer to FIG. 1(A).

The watersoluble photosensitive resin 2 is made by mixing polyvinyl alcohol, sodium dichromate($Na_2Cr_2O_7$) solution, acryl emulsion, propylene oxide ethylene oxide polymer.

Figure 2:
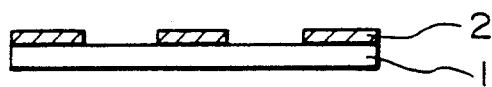

Thus, the watersoluble photosensitive resin 2 spread on the surface of the glass substrate 1 is dried in a drying furnace for about 5 minutes at a temperature of 35° to 38° C., and negative mask is set thereon so that the photosensitive resin 2 is removed, as forming a pattern for the cathode and, thereafter, it is exposed and developed. Consequently, the watersoluble photosensitive resin on the portion of the substrate where the cathode will be formed is removed(refer to FIG. 2).

Figure 3:
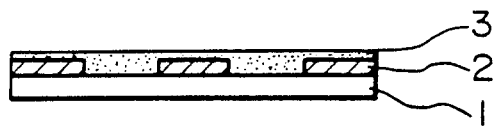

Subsequently, a nickel paste 3 for a cathode, made by combining a kasil, which is on adhering reinforcement agent, with nickel powder, is spread as shown in FIG. 3, and then the unnecessary portion of the nickel paste, for example, the nickel paste 3 on the watersoluble photosensitive resin, is removed.

There are two kinds of methods in which the nickel paste attached to the watersoluble photosensitive resin 2 is removed.

The first drying involves at about 75° C.-95° C. the nickel paste after it is spread and then spraying it with a hydrogen peroxide solution, and the second requires its deposition into a hydrogen peroxide solution maintained at a temperature of about 25° C.–45° C.

The watersoluble photosensitive resin 2 and, the nickel paste located on the watersoluble photosensitive resin 2 are removed by either one of said two methods.

Figure 4:

Consequently, the cathode 4 is formed on the surface of the glass substrate 1 as shown in FIG. 4.

Next, the anode 6 and barrier rib 7 are formed by the same method of used in forming the of said cathode 4. That is, the anode 6 is formed by the same method of forming as said cathode was and formed thereafter, forming the barrier ribs of the PDP according to the present invention.

For this purpose, when the watersensitive resin 2 is spread thickly, the thickness being of 100-120 μm, on the surface of the glass substrate with the anode 6 formed thereon and then mask for forming the barrier rib is set by a positive system, exposed and developed, the watersoluble photosensitive resin 2 of the other portion, except for the anode 6 is removed, and it becomes a state that said watersoluble photosensitive resin 2 being spread only on the surface of anode 6.

Figure 5:
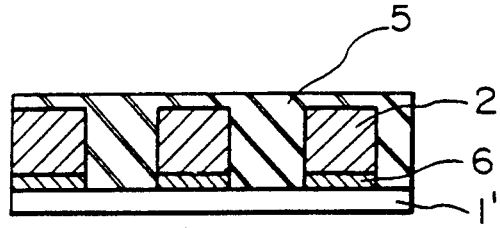

When a glass paste 5 for the barrier rib is spread on to this and dried, it becomes as shown in FIG. 5.

When it is contacted with a hydrogen peroxide solution at a state that said glass paste 5 for the barrier rib being spread, the watersoluble photosensitive resin 2 is removed at the same time, the glass paste spread on the surface of the photosensitive resin 2 is removed.

Figure 6:
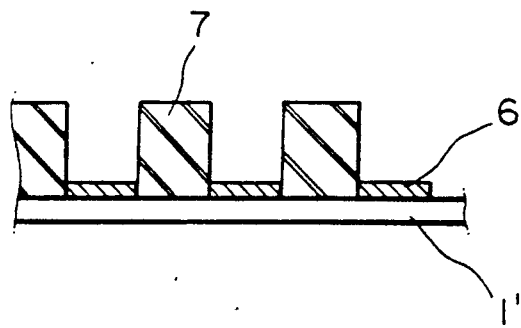

Therefore, the barrier rib 7 is formed between the anodes 6 as shown in FIG. 6.

The front side glass substrate 1' formed with the anodes 6 and barrier ribs 7 and the rear side glass substrate 1 formed with the cathodes 4 are manufactured by the process according to said photo-etching method, and these two glass substrates are sealed by a sealing material, so that the PDP is completely manufactured.

As described above, according to the present invention since the making of highly precise and elaborate patterns, which is a feature of the photo-etching method, can be applied to the manufacture of plasma display panels, the plasma display panel can be manufactured in conformity with the tendency of becoming larger in size, and there is advantage that the inferior goods producing rate arisen in the time of conventional screen printing is reduced.

It will be appreciated that the present invention is not restricted to the particular embodiment that has been described hereinbefore, and that variations and modifications may be made therein without departing from the spirit and scope of the invention as defined in the appended claims and equivalents thereof.

What is claimed is:

1. A method of manufacturing a plasma display panel comprising the steps of providing a first substrate; depositing a first layer of a water-soluble photosensitive resin on said first substrate; drying said first photosensitive resin layer; placing a negative photomask on said first photosensitive resin layer; exposing a portion of said first photosensitive resin layer through said negative photomask; developing and removing said exposed portion of said first photosensitive resin layer from said first substrate thereby leaving the unexposed portion of said first photosensitive resin layer on said first substrate; depositing a layer of a first electrode material on said unexposed portion of said first photosensitive resin layer and said first substrate so that a portion of said first electrode material layer is directly supported on said unexposed portion of said first photosensitive resin layer and the remaining portion of said first electrode material layer is directly supported on said first substrate; drying said first electrode material layer; removing said unexposed portion of said first photosensitive resin layer from said first substrate along with said portion of said first electrode material layer supported thereon to leave a first set of electrodes formed on said first substrate; providing a second substrate; depositing a second layer of a water-soluble photosensitive resin on said second substrate; drying said second photosensitive resin layer; placing a negative photomask on said second photosensitive resin layer; exposing a portion of said second photosensitive resin layer through said photomask; developing and removing said exposed portion of said second photosensitive resin layer from said second substrate thereby leaving the unexposed portion of said second photosensitive resin layer on said second substrate; depositing a layer of a second electrode material on said unexposed portion of said second photosensitive resin layer and said second substrate so that a portion of said second electrode material layer is directly supported on said unexposed portion of said second photosensitive resin layer and the remaining portion of said second electrode material layer is directly supported on said second substrate; drying said second electrode material layer; removing said unexposed portion of said second photosensitive resin layer from said second substrate along with said portion of second electrodes material supported thereon to leave a second set of electrodes formed on said second substrate; depositing a third layer of a water-soluble photosensitive resin on said second set of electrodes and said second substrate so that a portion of said third photosensitive resin layer is directly supported on said second set of electrodes and the remaining portion of said third photosensitive resin layer is directly supported on said second substrate; drying said third photosensitive resin layer; placing a positive photomask on said third photosensitive resin layer such that the portion of said third photosensitive resin layer supported on said second substrate can be exposed; exposing said portion of said third photosensitive resin layer supported on said second substrate through said positive photomask; developing and removing said exposed portion of said third photosensitive resin layer from said second substrate thereby leaving said second set of electrodes, and the unexposed portion of said third photosensitive resin supported thereon, on said second substrate; depositing a layer of a barrier material on said unexposed portion of said third photosensitive layer and said second substrate so that a portion of said barrier material layer is directly supported by said unexposed portion of said third photosensitive layer and the remaining portion of said barrier material layer is directly supported by said second substrate; drying said barrier material layer; removing said unexposed portion of said third photosensitive layer and said portion of barrier material layer supported thereon to leave a set of barrier ribs provided between said second set of electrodes on said second substrate; joining said first and second substrates so that said first and second set of electrodes are in face-to-face relationship with each other; and sealing said joined first and second substrates to form a plasma display panel.

2. The method of claim 1, wherein said first, second and third water-soluble photosensitive resin layers comprise polyvinyl alcohol, sodium dichromate, acryl emulsion, propylene oxide polymer and ethylene oxide polymer.

3. The method of claim 1, wherein said first electrode material comprises nickel.

4. The method of claim 1, wherein said unexposed portions of said first, second and third water-soluble photosensitive resin layers are removed by contacting them with a hydrogen peroxide solution.

5. The method of claim 1, wherein said first set of electrodes are cathodes and said second set of electrodes are anodes.

* * * * *